United States Patent
Watanabe

(10) Patent No.: US 10,985,794 B2
(45) Date of Patent: Apr. 20, 2021

(54) RADIO-FREQUENCY SWITCH AND COMMUNICATION DEVICE

(71) Applicant: Murata Manufacturing Co., Ltd., Nagaokakyo (JP)

(72) Inventor: Takashi Watanabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 20 days.

(21) Appl. No.: 16/413,712

(22) Filed: May 16, 2019

(65) Prior Publication Data

US 2019/0273528 A1 Sep. 5, 2019

Related U.S. Application Data

(63) Continuation of application No. PCT/JP2017/044998, filed on Dec. 14, 2017.

(30) Foreign Application Priority Data

Dec. 22, 2016 (JP) .............................. JP2016-250152

(51) Int. Cl.
*H04B 1/44* (2006.01)
*H03K 17/693* (2006.01)
*H04B 1/00* (2006.01)
*H04B 1/18* (2006.01)
*H04B 1/405* (2015.01)

(52) U.S. Cl.
CPC ............ *H04B 1/44* (2013.01); *H03K 17/693* (2013.01); *H04B 1/00* (2013.01); *H04B 1/18* (2013.01); *H04B 1/405* (2013.01)

(58) Field of Classification Search
CPC ..... H04B 1/44; H04B 1/00; H04B 1/18; H04B 1/405; H03K 17/693
USPC ...................................................... 455/78, 83
See application file for complete search history.

(56) References Cited

U.S. PATENT DOCUMENTS

2006/0199563 A1* 9/2006 Kelly ................... H04B 1/48
455/333
2011/0181342 A1 7/2011 Uejima et al.
(Continued)

FOREIGN PATENT DOCUMENTS

CN 103828249 A 5/2014
JP 2006-310968 A 11/2006
(Continued)

OTHER PUBLICATIONS

Official Communication issued in International Patent Application No. PCT/JP2017/044998, dated Mar. 6, 2018.

*Primary Examiner* — Ayodeji O Ayotunde
(74) *Attorney, Agent, or Firm* — Keating & Bennett, LLP

(57) ABSTRACT

A radio-frequency switch includes a first switch circuit including a first common terminal, at least two first selection terminals, a first switch that selectively connects the first common terminal and the at least two first selection terminals to each other, and a first shunt switch that switches the first common terminal and ground between a conductive state and a non-conductive state with each other, and a second switch circuit including a second common terminal that is connected to the first common terminal, at least two second selection terminals, and a second switch that selectively connects the second common terminal and the at least two two selection terminals to each other.

20 Claims, 8 Drawing Sheets

(56) References Cited

U.S. PATENT DOCUMENTS

| | | | |
|---|---|---|---|
| 2013/0076429 A1* | 3/2013 | Taddiken | H03K 17/693 327/419 |
| 2014/0203887 A1 | 7/2014 | Murata et al. | |
| 2014/0206299 A1 | 7/2014 | Murase et al. | |
| 2016/0127115 A1* | 5/2016 | Hayafuji | H04B 1/48 370/278 |
| 2017/0346452 A1 | 11/2017 | Wada et al. | |

FOREIGN PATENT DOCUMENTS

| | | |
|---|---|---|
| JP | 4715973 B2 | 7/2011 |
| JP | 2014-140115 A | 7/2014 |
| JP | 2016-021290 A | 2/2016 |
| WO | 2013/047358 A1 | 4/2013 |
| WO | 2015/008557 A1 | 1/2015 |
| WO | 2016/133028 A1 | 8/2016 |

* cited by examiner

RADIO-FREQUENCY SWITCH AND COMMUNICATION DEVICE

CROSS REFERENCE TO RELATED APPLICATIONS

This application claims the benefit of priority to Japanese Patent Application No. 2016-250152 filed on Dec. 22, 2016 and is a Continuation Application of PCT Application No. PCT/JP2017/044998 filed on Dec. 14, 2017. The entire contents of each of these applications are hereby incorporated herein by reference.

BACKGROUND OF THE INVENTION

1. Field of the Invention

The present invention relates to a radio-frequency switch and a communication device.

2. Description of the Related Art

In recent years, together with the increasing number of bands (multiple bands) used by communication devices, such as cellular phones, radio-frequency modules that perform transmission and reception in a plurality of communication bands are known. Such a radio-frequency module is provided with a switch circuit that has a common terminal that is connected to an antenna and a plurality of selection terminals that are connected to a radio-frequency circuit (transmission circuit or reception circuit) (for example, refer to Japanese Patent No. 4715973). Generally, it is necessary to achieve high isolation between the antenna and a radio-frequency circuit when the antenna and the radio-frequency circuit are not in a conductive state with each other. In the switch circuit, among the selection terminals of the switch circuit, a free port that is not connected to a radio-frequency circuit is connected to ground, and therefore isolation is able to be increased by connecting the common terminal of the switch circuit to the free port that is connected to ground.

In recent years, it has been demanded that carrier aggregation (CA) in which a plurality of different frequency bands are used simultaneously is supported. However, the above-described switch circuit of the related art does not support CA and a way of increasing isolation in a switch circuit that supports CA is not disclosed. "Isolation" refers to the degree of isolation between two arbitrary points.

SUMMARY OF THE INVENTION

Preferred embodiments of the present invention provide radio-frequency switches and communication devices that are each able to support CA and increase isolation.

A radio-frequency switch according to a preferred embodiment of the present invention includes a first switch circuit that includes a first common terminal, at least two first selection terminals, a first switch that selectively connects the first common terminal and the at least two first selection terminals to each other; and a first shunt switch that switches the first common terminal and ground between being in a conductive state and a non-conductive state with each other; and a second switch circuit that includes a second common terminal that is connected to the first common terminal, at least two second selection terminals, and a second switch that selectively connects the second common terminal and the at least two selection terminals to each other.

With this configuration, CA is able to be performed by putting the first common terminal and ground into a non-conductive state with each other using the first shunt switch, connecting the first common terminal and any one of the at least two first selection terminals to each other using the first switch, and connecting the second common terminal and any one of the at least two second selection terminals to each other using the second switch. That is, the radio-frequency switch supports CA. Furthermore, in the case in which CA is not performed, the first common terminal and ground are put into a conductive state with each other using the first shunt switch and the first common terminal is grounded. In other words, a signal that flows into the first common terminal flows to ground, and therefore, isolation between the first common terminal and the first selection terminals is able to be increased.

A radio-frequency switch according to a preferred embodiment of the present invention includes at least two circuits, namely, the first switch circuit and the second switch circuit in order to support CA. In other words, a matching network is able to be connected for every frequency band in which communication is to be simultaneously performed (in other words, for each of the first switch circuit and the second switch circuit, more specifically, for each of the first common terminal and the second common terminal). Therefore, since the circuit for achieving CA is provided by dividing the circuit into two circuits, the number of locations at which a matching network is able to be connected is increased, matching between other components (for example, an antenna element) and the radio-frequency switch is more easily achieved, and insertion loss is able to be reduced due to the improvement in return loss.

A circuit that is able to simultaneously electrically connect one common terminal and a plurality of paths may be considered as an example of a radio-frequency switch that supports CA (referred to as "simultaneously on circuit"). Since a radio-frequency switch according to a preferred embodiment of the present invention includes a smaller number of selection terminals to which the one common terminal is able to be connected by a switch than the simultaneously on circuit, the radio-frequency switch of the present invention can reduce insertion loss.

Thus, the radio-frequency switch is able to support CA and increase isolation, and is able to reduce insertion loss.

The second switch circuit may further include a second shunt switch that switches the second common terminal and ground between being in a conductive state and a non-conductive state with each other.

With this configuration, in the case in which the second common terminal and ground are put into a conductive state with each other using the second shunt switch, the second common terminal is grounded. In other words, a signal that flows into the second common terminal flows to ground, and therefore, isolation between the second common terminal and the second selection terminals is able to be increased.

The first switch circuit may be provided in a first chip, the first shunt switch may be built into the first chip, the second switch circuit may be provided in a second chip, and the second shunt switch may be built into the second chip.

With this configuration, since the first shunt switch to increase isolation is built into the first chip and the second shunt switch to increase isolation is built into the second chip, isolation is able to be improved while reducing or preventing an increase in the size of the module, in which the radio-frequency switch, the first shunt switch, and the second shunt switch are mounted, due to the addition of the first shunt switch and the second shunt switch.

The first switch circuit and the second switch circuit may be provided in one chip, and the first shunt switch and the second shunt switch may be built into the one chip.

With this configuration, the radio-frequency switch is able to be manufactured at low cost by providing the first switch circuit and the second switch circuit in one chip. In addition, since the first shunt switch and the second shunt switch, which increase isolation, are built into the chip, an increase in the size of the module, in which the radio-frequency switch, the first shunt switch, and the second shunt switch are mounted, due to the addition of the first shunt switch and the second shunt switch is able to be reduced or prevented while maintaining isolation.

The one chip may be provided with the first common terminal, the second common terminal, and a ground terminal that is connected to ground, and the ground terminal may be disposed between the first common terminal and the second common terminal.

The ground terminal is disposed between the first common terminal and the second common terminal, and therefore, the first common terminal and the second common terminal are separated by at least the distance occupied by the ground terminal. Furthermore, leakage of a signal between the first common terminal and the second common terminal is able to be blocked by the ground terminal. Thus, the isolation between the first common terminal and the second common terminal is able to be increased.

The first switch circuit may be used in communication in a first frequency band, the second switch circuit may be used in communication in a second frequency band, which is different from the first frequency band, the first shunt switch may be switched off and the first common terminal and ground may be in a non-conductive state with each other and the second shunt switch may be switched on and the second common terminal and ground may be in a conductive state with each other when transmission or reception of a signal is performed with the first frequency band being a pass band, and the first shunt switch may be switched on and the first common terminal and ground may be in a conductive state with each other and the second shunt switch may be switched off and the second common terminal and ground may be in a non-conductive state with each other when transmission or reception of a signal is performed with the second frequency band being the pass band.

With this configuration, when only the second frequency band is used in the case in which CA is not performed, the first common terminal and ground are put into a conductive state with each other using the first shunt switch and, as a result, isolation between the first common terminal and the first selection terminals is able to be increased. Furthermore, communication in the second frequency band is able to be performed by putting the second common terminal and ground into a non-conductive state with each other using the second shunt switch and putting the second common terminal and any of the second selection terminals into a conductive state with each other. On the other hand, when only the first frequency band is used in the case in which CA is not performed, the second common terminal and ground are put into a conductive state with each other using the second shunt switch and as a result isolation between the second common terminal and the second selection terminals can be increased. Furthermore, communication in the first frequency band is able to be performed by putting the first common terminal and ground into a non-conductive state with each other using the first shunt switch and putting the first common terminal and any of the first selection terminals into a conductive state with each other.

The first frequency band may be a band included in a region from approximately an 800 MHz band to approximately a 900 MHz band, and the second frequency band may be a band included in a region from approximately a 600 MHz band to approximately a 700 MHz band.

Specifically, the first frequency band may be Band 8 of long term evolution (LTE) and the second frequency band may be Band 20 of LTE. Alternatively, the first frequency band may be Band 8 of LTE and the second frequency band may be Band 28 of LTE. Alternatively, the first frequency band may be Band 26 of LTE and the second frequency band may be Band 12, Band 13, or Band 17 of LTE. Alternatively, the first frequency band may be Band 26 of LTE and the second frequency band may be Band 29 of LTE.

The first switch circuit may further include a first matching network that is provided on a path that connects the first common terminal and ground to each other via the first shunt switch, and the second switch circuit may further include a second matching network that is provided on a path that connects the second common terminal and ground to each other via the second shunt switch.

With this configuration, matching networks to obtain matching between the radio-frequency switch and other components are provided in the radio-frequency switch, and therefore, for example, a module in which the radio-frequency switch and the matching networks are mounted is able to be reduced in size compared with the case in which the matching networks are provided separately from the radio-frequency switch. In addition, since the first shunt switch and the second shunt switch are switched off and the first shunt switch and the second shunt switch are able to be regarded as capacitance components when CA is performed, matching is able to be obtained for the first switch circuit and the second switch circuit using these capacitance components and the matching networks. Furthermore, when CA is not performed, the shunt switch of the switch circuit corresponding to the frequency band not used in the communication is switched on and the shunt switch of the switch circuit corresponding to the frequency band used in the communication is switched off. For example, in the case in which the first shunt switch is switched on and the second shunt switch is switched off, the first matching network is shunt-connected to the second switch circuit. Therefore, matching is able to be performed for the second switch circuit using the first matching network, the second matching network, and the second shunt switch defining and functioning as a capacitance component. For example, in the case in which the first shunt switch is switched off and the second shunt switch is switched on, similarly, the second matching network is shunt-connected to the first switch circuit. Therefore, matching is able to be performed for the first switch circuit using the first matching network, the second matching network, and the first shunt switch defining and functioning as a capacitance component. Thus, since matching is able to be performed using a plurality of matching networks and a capacitance component, it becomes easier to perform impedance adjustment.

The first matching network and the first shunt switch may define a notch filter.

With this configuration, a notch filter is able to be defined by the first matching network and the first shunt switch defining and functioning as a capacitance component when switched off. Therefore, for example, in the case in which the first shunt switch is switched off and the second shunt switch is switched on, the attenuation characteristic outside the first frequency band is able to be improved by the notch filter defined by the first matching network and the first shunt switch.

The second matching network and the second shunt switch may define a notch filter.

With this configuration, a notch filter is able to be defined by the second matching network and the second shunt switch defining and functioning as a capacitance component when switched off. Therefore, for example, in the case in which the first shunt switch is switched on and the second shunt switch is switched off, the attenuation characteristic outside the second frequency band is able to be improved by the notch filter defined by the second matching network and the second shunt switch.

A radio-frequency switch according to a preferred embodiment of the present invention may further include an amplification circuit.

With this configuration, a radio-frequency switch, which includes an amplification circuit, is able to be provided that is able to support CA and increase isolation.

A communication device according to a preferred embodiment of the present invention includes an RF signal processing circuit that processes a radio-frequency signal transmitted or received by an antenna element; and a radio-frequency switch according to a preferred embodiment of the present invention that transmits the radio-frequency signal between the antenna element and the RF signal processing circuit.

With this configuration, a communication device is provided that is able to support CA and increase isolation.

The radio-frequency switches and communication devices according to preferred embodiments of the present invention are each able to support CA and increase isolation.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a diagram schematically illustrating the circuit of the radio-frequency switch according to the preferred embodiment 1 of the present invention and the circuits peripheral thereto when a first shunt switch is switched on.

FIG. 4 is a diagram schematically illustrating propagation of a signal in the radio-frequency switch according to the preferred embodiment 1 of the present invention when the first shunt switch is switched on.

DETAILED DESCRIPTION OF THE PREFERRED EMBODIMENTS

Figure 1:
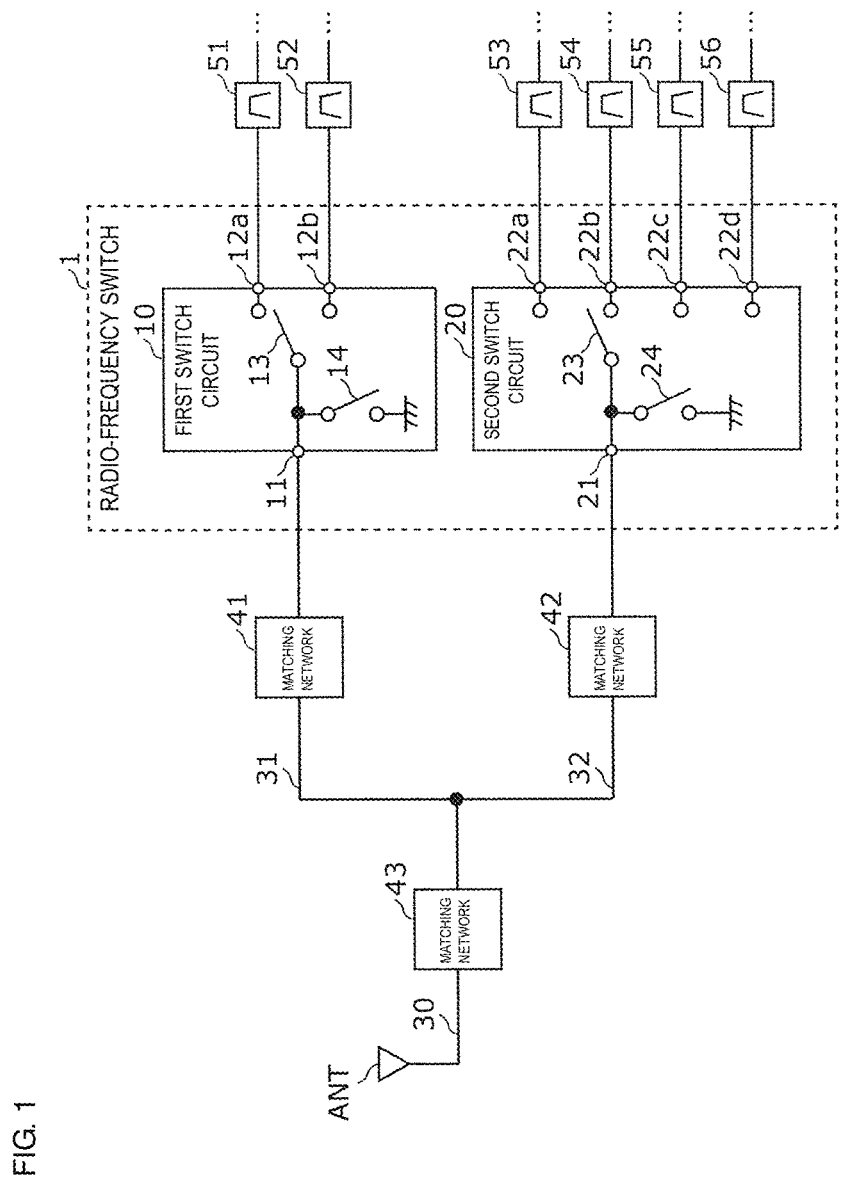
FIG. 1 is a configuration diagram of a radio-frequency switch according to a preferred embodiment 1 of the present invention and circuits peripheral thereto.

Hereafter, preferred embodiments of the present invention will be described in detail using examples and with reference to the accompanying drawings. The preferred embodiments described hereafter each illustrate a comprehensive or specific example of the present invention. The numerical values, shapes, materials, elements, arrangements of the elements, the ways in which the elements are connected, and other features and elements described in the following preferred embodiments are merely examples and are not intended to limit the scope of the present invention. Elements not described in the independent claims in the following preferred embodiments are described as arbitrary or optional elements. In addition, the sizes of the elements illustrated in the drawings are not necessarily strictly accurate. Furthermore, in the drawings, configurations that are the same or substantially the same as each other are denoted by the same symbols and repeated description thereof may be omitted or simplified. In addition, in the following preferred embodiments, "is connected" is not limited to meaning directly connected and also includes the case of being electrically connected via another element or other structure.

Preferred Embodiment 1

FIG. 1 is a configuration diagram of a radio-frequency switch 1 according to a preferred embodiment 1 of the present invention and circuits peripheral thereto. In FIG. 1, in addition to the radio-frequency switch 1, an antenna ANT, matching networks 41 to 43, and filters 51 to 56 are illustrated.

The antenna ANT transmits and receives radio-frequency signals and supports multiple bands in accordance with a communication standard, such as long term evolution (LTE), for example.

The radio-frequency switch 1 supports carrier aggregation (CA) in which at least two different frequency bands are simultaneously used, and is provided in the front end of a communication device, such as a cellular phone, for example. In the present preferred embodiment, the radio-frequency switch 1 is connected to the antenna ANT. The radio-frequency switch 1 divides a radio-frequency signal transmitted or received by the antenna ANT into the paths of the filters 51 to 56.

The radio-frequency switch 1 includes a first switch circuit 10 and a second switch circuit 20. The first switch circuit 10 is used in communication in a first frequency band among at the least two frequency bands simultaneously used in CA (first frequency band and second frequency band in the present preferred embodiment). Furthermore, the second switch circuit 20 is used in communication in the second frequency band, which is different from the first frequency band. A path 30 connected to the antenna ANT splits into a path 31 and a path 32, and the path 31 is connected to the first switch circuit 10 and the path 32 is connected to the second switch circuit 20. Thus, the first frequency band and the second frequency band are able to be simultaneously used by the first switch circuit 10 and the second switch circuit 20.

The first frequency band is preferably, for example, a band included in a region from an 800 MHz band to a 900 MHz band and defines a low band (LB), and the first frequency band preferably includes Band 8 and Band 26 of LTE, for example. The second frequency band is preferably, for example, a band included in a region from a 600 MHz band to a 700 MHz band and defines a very low band (VLB), and the second frequency band preferably includes Band 20, Band 12/13/17, Band 28, and Band 29 of LTE, for example.

The first switch circuit 10 includes a first common terminal 11 that is connected to the antenna ANT, at least two first selection terminals (here, two first selection terminals 12a and 12b), a first switch 13 that selectively connects the first common terminal 11 and the 2 first selection terminals 12a and 12b to each other, and a first shunt switch 14 that switches the first common terminal 11 and ground between a conductive state and a non-conductive state with each other.

For example, the first switch 13 selectively connects the first common terminal 11 to one of the two first selection terminals 12a and 12b based on a control signal from the outside (for example, from an RF signal processing circuit described below). The first switch 13 does not have to connect the first common terminal 11 to either of the two first selection terminals 12a and 12b. That is, the first common terminal 11 does not have to be connected to either of the first selection terminals 12a and 12b. Furthermore, for example, the first shunt switch 14 switches the first common terminal 11 and ground between a conductive state and a non-conductive state with each other based on a control signal from the outside.

The first common terminal 11 is connected to the antenna ANT via the path 31. Specifically, the first common terminal 11 is connected to the antenna ANT via the matching network 41 provided on the path 31 and the matching network 43 provided on the path 30. For example, when the first shunt switch 14 is switched off and the first common terminal 11 and ground are in a non-conductive state with each other, the first common terminal 11 is connected to either one of the first selection terminals 12a and 12b. In addition, for example, when the first shunt switch 14 is switched on and the first common terminal 11 and ground are in a conductive state with each other, the first common terminal 11 is not connected to either one of the first selection terminals 12a and 12b.

In the present preferred embodiment, the first selection terminals 12a and 12b correspond to different frequency bands included in the first frequency band (LB), and preferably, the first selection terminal 12a corresponds to Band 8 (about 880 MHz to about 960 MHz), for example, and the first selection terminal 12b corresponds to Band 26 (about 814 MHz to about 894 MHz), for example. Specifically, the first selection terminal 12a is connected to the filter 51 having Band 8 as a pass band. In addition, the first selection terminal 12b is connected to the filter 52 having Band 26 as a pass band. These frequency bands lie in a range including transmission and reception. Furthermore, the frequency bands corresponding to the first selection terminals 12a and 12b are not limited to these examples.

In the present preferred embodiment, the first switch circuit 10 is preferably, for example, a single pole double throw (SPDT) radio-frequency switch integrated circuit (IC) and is, for example, defined by a chip. Here, "chip" refers to a semiconductor chip or package. Furthermore, the various terminals of the first switch circuit 10 (first common terminal 11 and first selection terminals 12a and 12b) are preferably bumps or surface electrodes (pads) provided on the chip, for example. In addition, the first switch 13 and the first shunt switch 14 are preferably built into the chip, for example.

The second switch circuit 20 includes a second common terminal 21 that is connected to the antenna ANT, at least two second selection terminals (here, four second selection terminals 22a to 22d), a second switch 23 that selectively connects the second common terminal 21 and the four second selection terminals 22a to 22d to each other, and a second shunt switch 24 that switches the second common terminal 21 and ground between a conductive state and a non-conductive state with each other.

For example, the second switch 23 selectively connects the second common terminal 21 to any one of the four second selection terminals 22a to 22d based on a control signal from the outside. The second switch 23 does not have to connect the second common terminal 21 to any of the four second selection terminals 22a to 22d. That is, the second common terminal 21 does not have to be connected to any of the second selection terminals 22a to 22d. Furthermore, for example, the second shunt switch 24 switches the second common terminal 21 and ground between a conductive state and a non-conductive state with each other based on a control signal from the outside.

The second common terminal 21 is connected to the antenna ANT via the path 32. Specifically, the second common terminal 21 is connected to the antenna ANT via the matching network 42 provided on the path 32 and the matching network 43 provided on the path 30. Since the path 32 and the path 31 branch off from the path 30, the path 31 and the path 32 are connected to each other. Therefore, the second common terminal 21 is connected to the first common terminal 11. For example, when the second shunt switch 24 is switched off and the second common terminal 21 and ground are in a non-conductive state with each other, the second common terminal 21 is connected to any one of the second selection terminals 22a to 22d. In addition, for example, when the second shunt switch 24 is switched on and the second common terminal 21 and ground are in a conductive state with each other, the second common terminal 21 is not connected to any one of the second selection terminals 22a to 22d.

In the present preferred embodiment, the second selection terminals 22a to 22d correspond to different frequency bands included in the second frequency band (VLB), and preferably the second selection terminal 22a corresponds to Band 20 (about 791 MHz to about 862 MHz) for example, the second selection terminal 22b corresponds to Band 12 (about 699 MHz to about 746 MHz)/Band 13 (about 746 MHz to about 787 MHz)/Band 17 (about 704 MHz to about 746 MHz) for example, the second selection terminal 22c corresponds to Band 28 (about 703 MHz to about 803 MHz), and the second selection terminal 22d corresponds to Band 29 (about 717 MHz to about 727 MHz) for example. Specifically, the second selection terminal 22a is connected to the filter 53 having Band 20 as a pass band. In addition, the second selection terminal 22b is connected to the filter 54 having Band 12/13/17 as a pass band. In addition, the second selection terminal 22c is connected to the filter 55 having Band 28 as a pass band. In addition, the second selection terminal 22d is connected to the filter 56 having Band 29 as a pass band. These frequency bands (except Band 29) lie in a range including transmission and reception. Furthermore, the frequency bands corresponding to the second selection terminals 22a to 22d are not limited to these examples.

In the present preferred embodiment, the second switch circuit 20 is preferably, for example, a single pole n throw (SPnT) (n=4) radio-frequency switch IC and is, for example, define by a chip. Furthermore, the various terminals of the second switch circuit 20 (second common terminal 21 and second selection terminals 22a to 22d) are preferably bumps or surface electrodes (pads) provided on the chip forming the second switch circuit 20, for example. In addition, the second switch 23 and the second shunt switch 24 are preferably built into the chip, for example.

The first switch 13, the first shunt switch 14, the second switch 23, and the second shunt switch 24 are preferably, for example, field effect transistor (FET) switches or diode switches made of GaAS or a complementary metal oxide semiconductor (CMOS).

The matching networks 41 to 43 are connected between the antenna ANT and the radio-frequency switch 1 and provide matching between the antenna ANT and the radio-frequency switch 1. Specifically, matching is achieved between the antenna ANT and the first switch circuit 10 in the first frequency band by the matching networks 41 and 43. As will be described in detail below, matching is achieved between the antenna ANT and the first switch circuit 10 using the matching networks 41 to 43 when the second shunt switch 24 is switched on. Furthermore, matching is achieved between the antenna ANT and the second switch circuit 20 in the second frequency band by the matching networks 42 and 43. As will be described in detail below, matching is achieved between the antenna ANT and the second switch circuit 20 using the matching networks 41 to 43 when the first shunt switch 14 is switched on. The matching networks 41 to 43 are preferably defined by, for example, inductors, capacitors, or a combination of inductors and capacitors.

The filter 51 to 56 each define a band pass filter that enables a signal of a prescribed frequency band to pass therethrough. The filters 51 to 56 are preferably defined by, for example, surface acoustic wave (SAW) resonators, bulk acoustic wave (BAW) resonators, film bulk acoustic resonators (FBAR), or other suitable filters. In addition, the filters 51 to 56 may be LC resonant circuits including inductors, capacitors, for example. In the case in which the filters 51 to 56 are SAW filters including SAW resonators, the filters 51 to 56 include a substrate and interdigital transducer (IDT) electrodes.

The substrate has piezoelectricity at at least the surface thereof. For example, the substrate may include a piezoelectric thin film at the surface thereof, and may include a multilayer body including the piezoelectric thin film, a film having a different acoustic velocity from the piezoelectric thin film, a support substrate, and other suitable structure. In addition, for example, the substrate may be a multilayer body including a high-acoustic-velocity support substrate and a piezoelectric thin film provided on the high-acoustic-velocity support substrate, a multilayer body including a high-acoustic-velocity support substrate, a low-acoustic-velocity film provided on the high-acoustic-velocity support substrate, and a piezoelectric thin film provided on the low-acoustic-velocity film, or a multilayer body including a support substrate, a high-acoustic-velocity film provided on the support substrate, a low-acoustic-velocity film provided on the high-acoustic-velocity film, and a piezoelectric thin film provided on the low-acoustic-velocity film. The entire substrate may alternatively have piezoelectricity. Here, it is assumed that the filters 51 to 56 are defined by surface acoustic wave resonators. Consequently, since the filters 51 to 56 are able to be defined using IDT electrodes provided on a piezoelectric substrate, compact low-profile filters having bandpass characteristics with a high degree of steepness are able to be obtained.

Although not illustrated, matching networks providing matching between the radio-frequency switch 1 and the filters 51 to 56 are preferably provided between the radio-frequency switch 1 and the filters 51 to 56.

With such a circuit configuration, the radio-frequency switch 1 is able to support CA.

Hereafter, operation of the radio-frequency switch 1 when CA is performed will be described.

CA is performed when the first shunt switch 14 and the second shunt switch 24 are switched off and the first common terminal 11 and the second common terminal 21 are in a non-conductive state with ground. For example, communication in any band within the first frequency band and communication in any band within the second frequency band are simultaneously performed. As specific examples of combinations of frequency bands for which CA may be performed, a combination in which the first frequency band is Band 8 and the second frequency band is Band 20, a combination in which the first frequency band is Band 8 and the second frequency band is Band 28, a combination in which the first frequency band is Band 26 and the second frequency band is Band 12, Band 13, or Band 17, and a combination in which the first frequency band is Band 26 and the second frequency band is Band 29 may preferably be performed. For example, communication in Band 8 and communication in Band 20 are simultaneously performed by connecting the first common terminal 11 and the first selection terminal 12a to each other and connecting the second common terminal 21 and the second selection terminal 22a to each other, and communication in Band 8 and communication in Band 28 are simultaneously performed by connecting the first common terminal and the first selection terminal 12a to each other and connecting the second common terminal 21 and the second selection terminal 22c to each other.

Furthermore, the radio-frequency switch 1 includes at least two circuits, namely, the first switch circuit 10 and the second switch circuit 20 in order to support CA. That is, a matching network is able to be connected for every frequency band in which communication is to be simultaneously performed (in other words, for each of the first switch circuit 10 and the second switch circuit 20, more specifically, for each of the first common terminal 11 and the second common terminal 21). Specifically, the matching network 41, for the first frequency band, is connected to the first common terminal 11 and the matching network 42, for the second frequency band, is connected to the second common terminal 21. Therefore, since the circuit enabling CA is provided by dividing the circuit into two circuits, the number of locations at which a matching network is able to be connected is increased, matching between the antenna ANT and the radio-frequency switch 1 is more easily achieved, and insertion loss is able to be reduced due to the improvement in return loss.

Next, a radio-frequency switch 100 according to a comparative example, which is another example of a radio-frequency switch that can support CA, and the radio-frequency switch 1 according to the present preferred embodiment will be compared.

Figure 2:
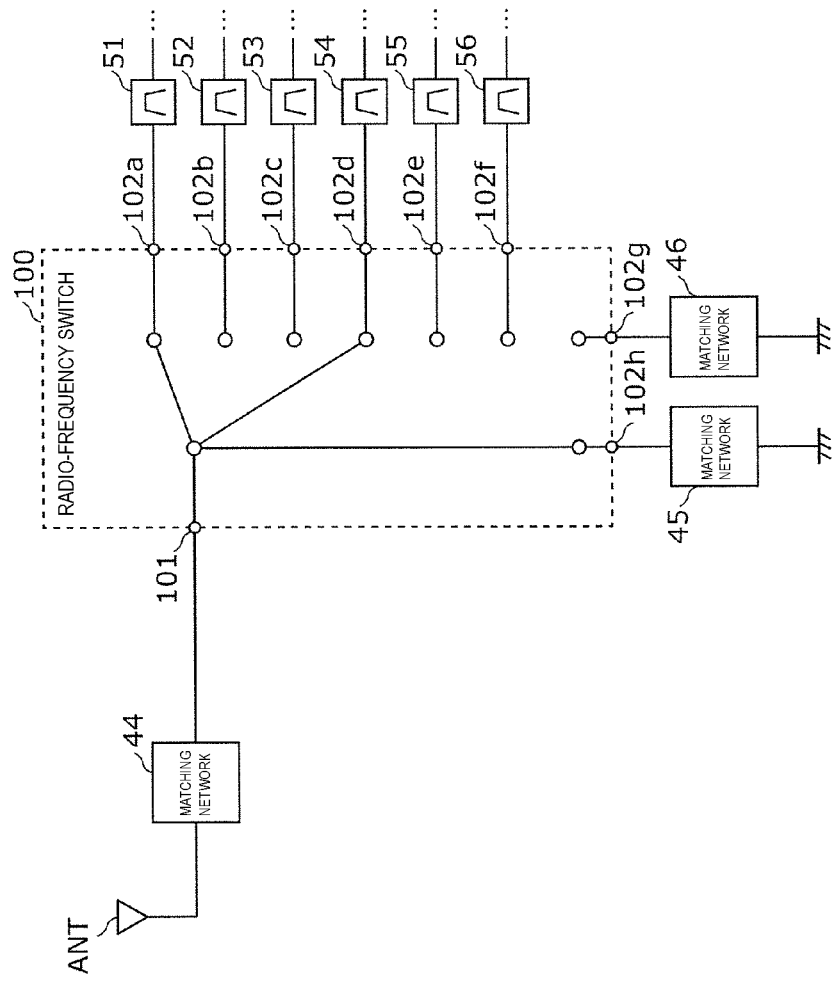
FIG. 2 is a configuration diagram of a radio-frequency switch according to a comparative example and circuits peripheral thereto.

FIG. 2 is a configuration diagram of the radio-frequency switch 100 according to a comparative example and circuits peripheral thereto.

The radio-frequency switch 100 includes a common terminal 101 that is connected to an antenna ANT, eight selection terminals 102a to 102h, and a switch that simultaneously connects the common terminal 101 and one or more selection terminals from among the eight selection terminals 102a to 102h to each other. In other words, the radio-frequency switch 100 is able to simultaneously electrically connect the one common terminal 101 and a plurality of paths to each other. FIG. 2 illustrates a state in which the common terminal 101 is simultaneously connected to the common terminals 102a and 102d. Thus, for example, communication in Band 8, which is the pass band of a filter 51, and communication in Band 20, which is the pass band of a filter 54, are simultaneously performed.

Furthermore, although matching is achieved between the antenna ANT and the radio-frequency switch 100 by a matching network 44, it is necessary to obtain matching across a wide frequency band from VLB to LB (from about 700 MHz band to about 900 MHz band), for example, and therefore, matching networks 45 and 46 are provided in addition to the matching network 44. Thus, matching is able to be obtained across a wide frequency band using the combination of the matching network 44 and the matching network or 46 by connecting the common terminal 101 to one of the selection terminals 102h and 102g in accordance with the frequency band in which communication is to be performed. In FIG. 2, the common terminal 101 and the selection terminal 102h are connected to each other and matching in Band 8 (pass band of filter 51) and matching in Band 12/13/17 is performed between the antenna ANT and the radio-frequency switch 100 by the matching networks 44 and 45.

However, in the radio-frequency switch 100, selection terminals to which the common terminal 101 is able to be connected by the switch are selection terminals that correspond to both of the first frequency band (Bands 8 and 26) and the second frequency band (Bands 20, 12/13/17, 28, 29), and there are a large number of selection terminals. Specifically, there are two selection terminals that correspond to the first frequency band, namely, the selection terminals 102a and 102b and there are four selection terminals that correspond to the second frequency band, namely, the selection terminals 102c to 102f. Furthermore, selection terminals to which the common terminal 101 is able to be connected by the switch also include the selection terminals 102g and 102h, to which the matching networks 45 and 46 are connected. Therefore, in the radio-frequency switch 100, the number of selection terminals to which the common terminal 101 is able to be connected is eight, which is a large number. As the number of terminals (selection terminals) to which the common terminal 101 is able to be connected by the switch increases, the insertion loss of the switch becomes larger. This is because the capacitive components generated between the common terminal 101 and the selection terminals increase.

In contrast, in the radio-frequency switch 1 that enables communication to be simultaneously performed in the same number of frequency bands as the radio-frequency switch 100, the number of terminals to which the first common terminal 11 is able to be connected by the first switch 13 is two and the number of terminals to which the second common terminal 21 can be connected to by the second switch 23 is four. In other words, the number of selection terminals for each switch circuit is smaller in the radio-frequency switch 1 than in the radio-frequency switch 100. Therefore, insertion loss of the radio-frequency switch 1 is able to be reduced.

The operation of the radio-frequency switch 1 when CA is performed has been described above, and the operation of the radio-frequency switch 1 when CA is not performed will be described below.

CA is not performed when one of the first common terminal 11 and the second common terminal 21 is in a conductive state with ground as a result of one of the first shunt switch 14 and the second shunt switch 24 being switched on and the other of the first shunt switch 14 and the second shunt switch 24 being switched off. Specifically, in the case in which CA is not performed, when a signal is transmitted or received with the first frequency band (specifically, only the first frequency band of the at least two frequency bands that are simultaneously used) being the pass band, the first shunt switch 14 is switched off and the first common terminal 11 and ground are in a non-conductive state with each other, and the second shunt switch 24 is switched on and the second common terminal 21 and ground are in a conductive state with each other. In addition, when a signal is transmitted or received with the second frequency band (specifically, only the second frequency band of the at least two frequency bands) being the pass band, the first shunt switch 14 is switched on and the first common terminal 11 and ground are in a conductive state with each other, and the second shunt switch 24 is switched off and the second common terminal 21 and ground are in a non-conductive state with each other. Here, referring to FIGS. 3 to 5, description will be provided of the case in which only the second frequency band is used and the first shunt switch 14 is switched on and the first common terminal 11 and ground are in a conductive state with each other, and the second shunt switch 24 is switched off and the second common terminal 21 and ground are in a non-conductive state with each other.

Figure 3:
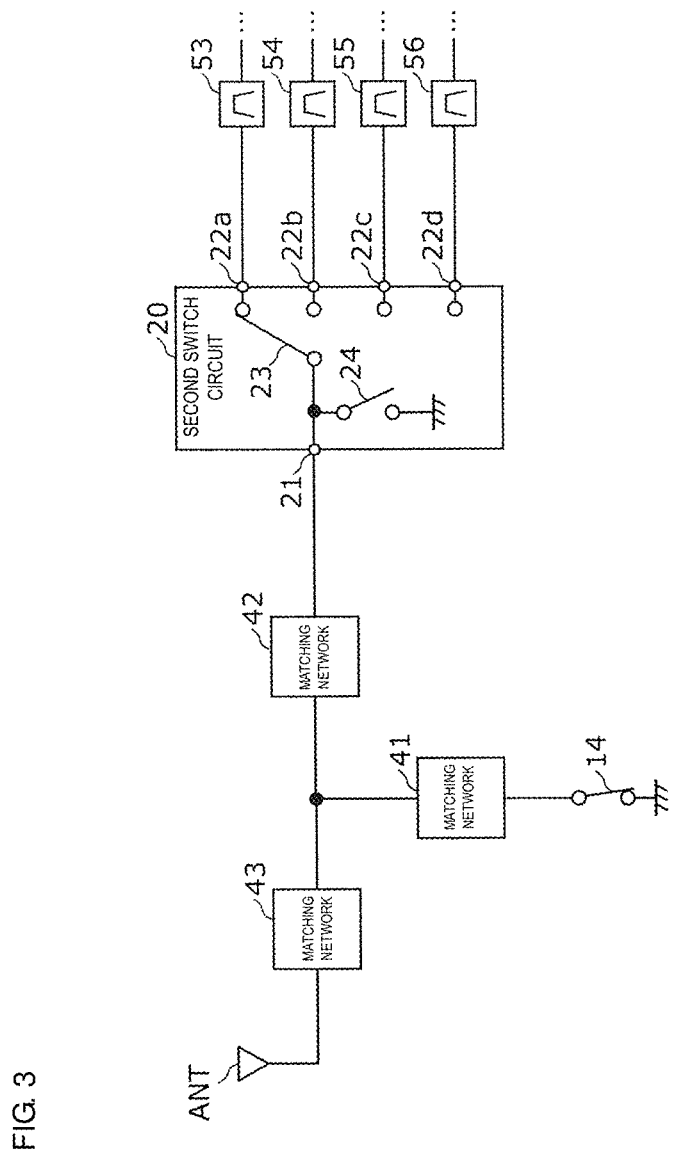

FIG. 3 is a diagram schematically illustrating the circuit of the radio-frequency switch 1 according to the preferred embodiment 1 and the circuits peripheral thereto when the first shunt switch 14 is switched on. In FIG. 3, since the first common terminal 11 and ground are in a conductive state with each other, illustration of the configuration of the first switch circuit 10 except for the first shunt switch 14 is omitted.

As illustrated in FIG. 3, matching between the second switch circuit 20 used in communication in the second frequency band and the antenna ANT is able to be performed by the matching network 41, in addition to the matching networks 42 and 43. This is because the first common terminal 11, to which the matching network 41 is connected, is connected to ground and the matching network 41 is shunt-connected to the matching networks 42 and 43. Thus, in the case in which CA is not performed, the matching network that is connected to the common terminal of the switch circuit that is not used in the communication is also able to be used in the matching of the switch circuit used in the communication, and therefore, matching is able to be performed more flexibly.

Next, an improvement of isolation in the radio-frequency switch 1 when CA is not performed will be described.

Figure 4:
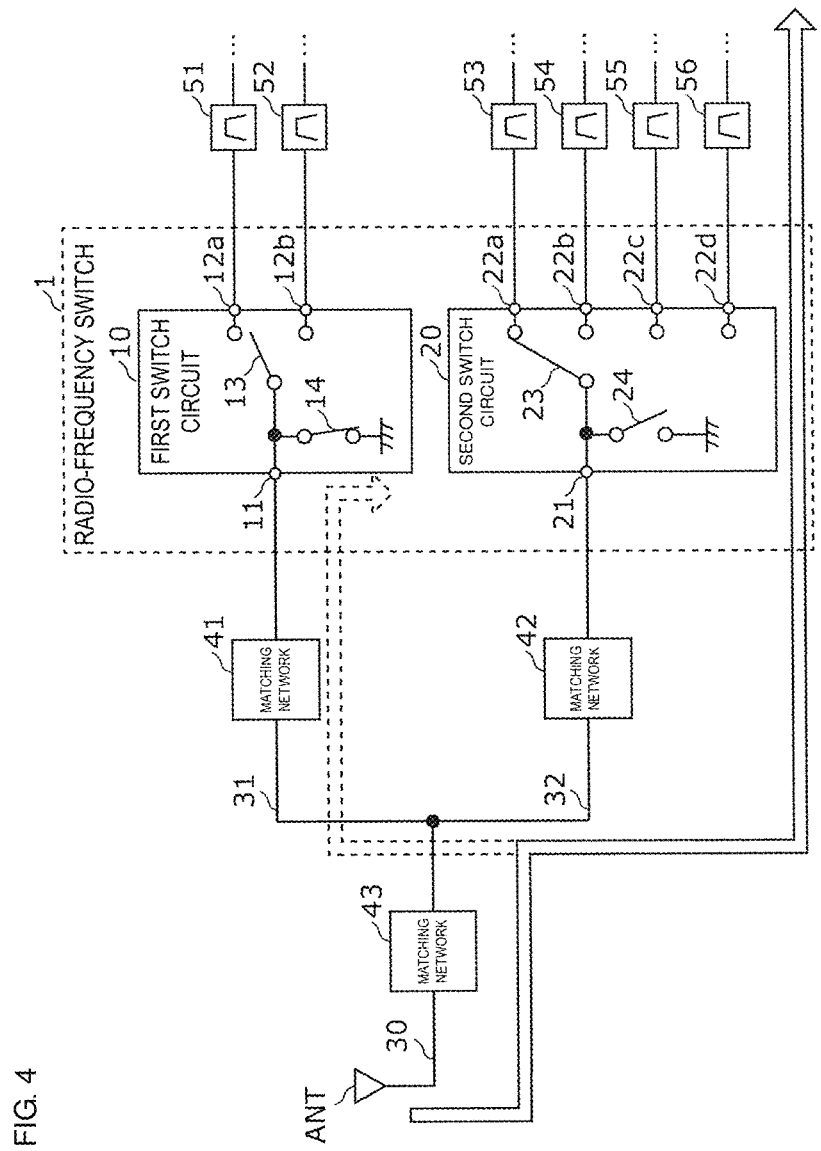

FIG. 4 is a diagram schematically illustrating propagation of a signal in the radio-frequency switch 1 according to the preferred embodiment 1 when the first shunt switch 14 is switched on.

When communication is performed in the second frequency band, the second shunt switch 24 is switched off and the second common terminal 21 and any one of the second selection terminals 22a to 22d are connected to each other by the second switch 23. Here, for example, the second common terminal 21 and the second selection terminal 22a are connected to each other by the second switch 23. Thus, as illustrated by the solid-line arrow in FIG. 4, a radio-frequency signal received by the antenna ANT flows to the filter 53 via the paths 30 and 32, the second common terminal 21, and the second selection terminal 22a, and communication in Band 20, which is the pass band of the filter 53, of the second frequency band is performed.

Generally, in a switch circuit that is not provided with a shunt switch, such as the first shunt switch 14 or the second shunt switch 24, the common terminal and a selection terminal of the switch circuit are not connected to each other by the switch of the switch circuit when communication is not performed in the pass band of a filter that is connected to the switch circuit. However, since the switch is preferably, for example, an FET switch, even in the case in which the common terminal and the selection terminal are not connected to each other, a signal may leak from the common terminal to the selection terminal. Therefore, a radio-frequency signal received by the antenna element will undesirably flow to the filter connected to the selection terminal via the common terminal and the selection terminal. That is, isolation between the common terminal and the selection terminal is degraded. The common terminal is connected to the antenna element and the selection terminals are connected to radio-frequency circuits (filters and circuits connected to filters). In other words, isolation between the antenna element and the radio-frequency circuits is degraded.

However, in the preferred embodiment 1, the first switch 10 is provided with the first shunt switch 14, and the first common terminal 11 and ground are connected to each other by switching the first shunt switch 14 on. As a result, as illustrated by the broken line arrow in FIG. 4, a signal that flows into the first common terminal 11 flows to ground, and therefore, it is unlikely that a signal will leak from the first common terminal 11 to the first selection terminals 12a and 12b, and isolation between the first common terminal 11 and the first selection terminals 12a and 12b is able to be improved.

Figure 5:
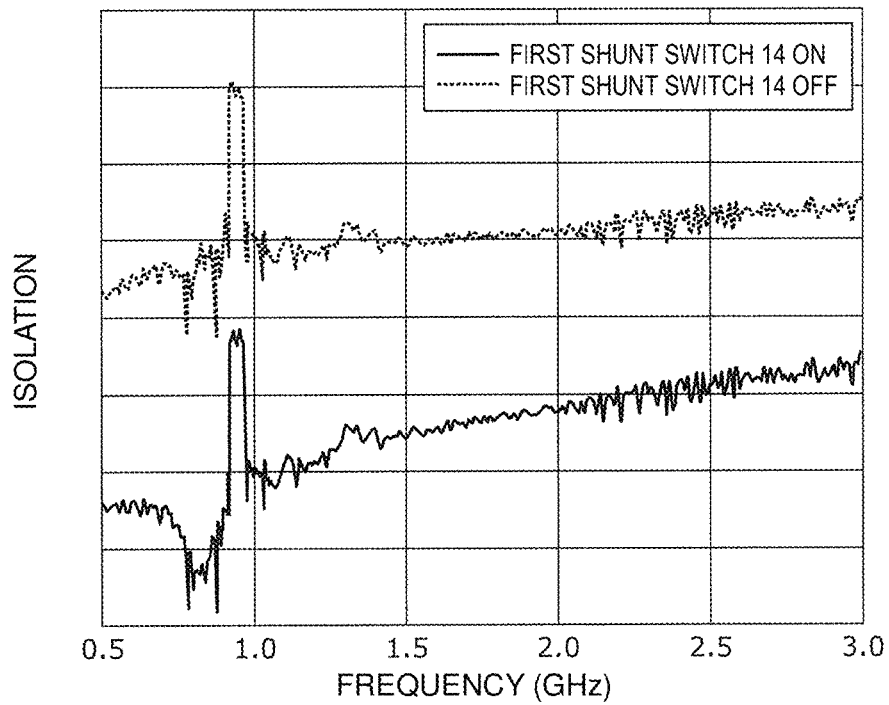
FIG. 5 is a graph illustrating isolation between a first common terminal and a first selection terminal when the first shunt switch is switched on and off.

FIG. 5 is a graph illustrating the isolation between the first common terminal 11 and the first selection terminal 12a at times when the first shunt switch 14 is switched on and off. In FIG. 5, the bandpass characteristic from the first common terminal to the first selection terminal 12a is illustrated as the isolation. In other words, the vertical axis represents the ratio of the strength of a radio-frequency signal measured at the first selection terminal 12a with respect to the strength of a radio-frequency signal input from the first common terminal 11, and isolation is illustrated as increasing in the downward direction in the graph. The horizontal axis represents frequency and a frequency band that includes the pass band of the filter 51 connected to the first selection terminal 12a is illustrated.

As illustrated in FIG. 5, it is clear that compared with the case in which the first switch 13 is not connecting the first common terminal 11 to either of the two first selection terminals 12a and 12b and the first shunt switch 14 is switched off, isolation between the first common terminal 11 and the first selection terminal 12a is increased when the first shunt switch 14 of the first switch 13 is switched on. Thus, in a switch circuit in which a signal of a frequency band that is not used in the communication flows (here, first switch circuit 10), isolation between the common terminal of the switch circuit (here, first common terminal 11) and the selection terminals of the switch circuit (here, first selection terminals 12a and 12b) is able to be increased.

The radio-frequency switch 1, the matching networks 41 to 43, the filters 51 to 56, and suitable elements are preferably mounted on one substrate and modularized, for example. At this time, the radio-frequency switch 1 (first switch circuit 10 and second switch circuit 20) is, for example, mounted on one main surface of the substrate and a ground layer in which ground terminals of the first switch circuit 10 and the second switch circuit 20 are connected to each other is provided in a layer close to the one main surface of the substrate. Thus, wiring lines that connect the ground terminals and the ground layer are short (in other words, inductor components are small), a signal is unlikely to flow around to the ground terminals, and isolation is able to be further increased.

As described above, the first switch circuit 10 is preferably defined by a chip and the first shunt switch 14 is built into the chip, and the second switch circuit 20 is preferably defined by a chip and the second shunt switch 24 is built into the chip.

Figure 6:
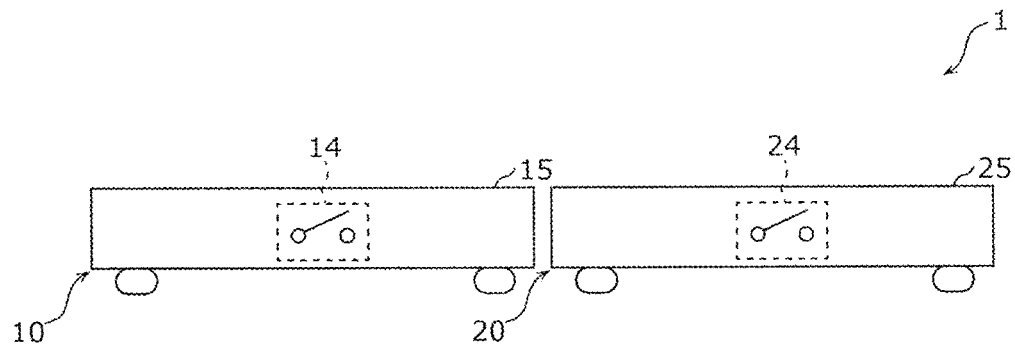
FIG. 6 is a diagram schematically illustrating a state in which a first shunt switch and a second shunt switch are built into a first chip and a second chip.

FIG. 6 is a diagram schematically illustrating a state in which the first shunt switch 14 and the second shunt switch 24 are built into a first chip 15 and a second chip 25, respectively. As schematically illustrated in FIG. 6, the first shunt switch 14 is not provided separately from the first chip 15 and rather is built into the first chip 15, and the second shunt switch 24 is not provided separately from the second chip 25 and rather is built into the second chip 25, and therefore, an increase in the size of the module in which the radio-frequency switch 1, the first shunt switch 14, and the second shunt switch 24 are mounted is able to be reduced or prevented.

As described above, CA is able to be performed with the radio-frequency switch 1 according to the preferred embodiment 1 by putting the first common terminal 11 and ground into a non-conductive state with each other using the first shunt switch 14, connecting the first common terminal 11 and either one of the at least two first selection terminals 12a and 12b to each other using the first switch 13, and connecting the second common terminal 21 and either one of the at least two second selection terminals 22a to 22d to each other using the second switch 23. In other words, the radio-frequency switch 1 supports CA. Furthermore, in the case in which CA is not performed, the first common terminal 11 and ground are put into a conductive state with each other using the first shunt switch 14 and the first common terminal 11 is grounded. In other words, a signal that flows into the first common terminal 11 flows to ground, and therefore, isolation between the first common terminal 11 and the first selection terminals 12a and 12b is able to be increased.

Furthermore, in the case in which the second common terminal 21 and ground are put in a conductive state with each other by the second shunt switch 24, the second common terminal 21 is grounded. In other words, a signal that flows into the second common terminal 21 flows to ground, and therefore, isolation between the second common terminal 21 and the second selection terminals 22a to 22d is able to be increased.

In addition, since the first shunt switch 14 that increases isolation is built into the first chip 15 and the second shunt switch 24 that increases isolation is built into the second chip 25, isolation is able to be improved while reducing or preventing an increase in the size of the module, in which the radio-frequency switch 1, the first shunt switch 14, and the second shunt switch 24 are mounted, caused by the addition of the first shunt switch 14 and the second shunt switch 24.

Furthermore, when only the second frequency band is used of the first frequency band and the second frequency band in the case in which CA is not performed, the first common terminal 11 and ground are put into a conductive state with each other using the first shunt switch 14, and isolation between the first common terminal 11 and the first selection terminals 12a and 12b is able to be increased. Furthermore, communication in the second frequency band is able to be performed by putting the second common terminal 21 and ground into a non-conductive state with each other using the second shunt switch 24 and putting the second common terminal 21 and any one of the second selection terminals 22a to 22d into a conductive state with each other. On the other hand, when only the first frequency band is used in the case in which CA is not performed, the second common terminal 21 and ground are put into a conductive state with each other using the second shunt switch 24, and isolation between the second common terminal 21 and the second selection terminals 22a to 22d is able to be increased. Furthermore, communication in the first frequency band is able to be performed by putting the first common terminal 11 and ground into a non-conductive state with each other using the first shunt switch 14 and putting the first common terminal 11 and either of the first selection terminals 12a and 12b into a conductive state with each other.

Preferred Embodiment 2

In the preferred embodiment 1, the first switch circuit 10 and the second switch circuit 20 are separately provided in the first chip 15 and the second chip 25, but the first switch circuit 10 and the second switch circuit 20 may preferably be provided in a single chip (semiconductor chip).

Figure 7A:
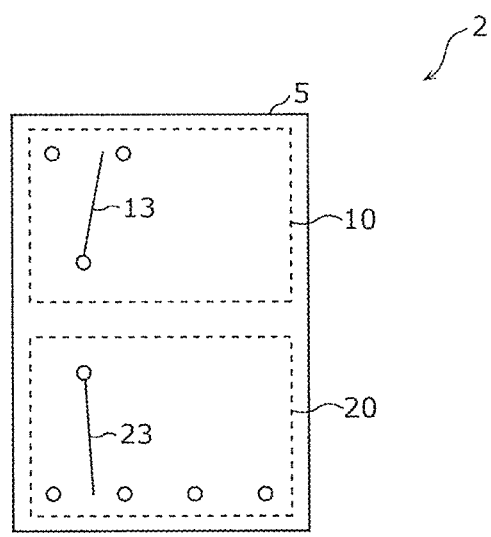
FIG. 7A is a diagram schematically illustrating a state in which a first switch circuit and a second switch circuit are formed in a single chip.

FIG. 7A is a diagram schematically illustrating a state in which the first switch circuit 10 and the second switch circuit 20 are provided in a single chip 5. FIG. 7A is a plan view of a radio-frequency switch 2 according to a preferred embodiment 2 of the present invention. As schematically illustrated in FIG. 7A, since the first switch circuit 10 and the second switch circuit 20 are not provided in separate chips and are instead provided in the single chip 5, the radio-frequency switch 2 is able to be manufactured at low cost.

Furthermore, the first shunt switch 14 and the second shunt switch 24 may preferably be built into the single chip 5.

Figure 7B:
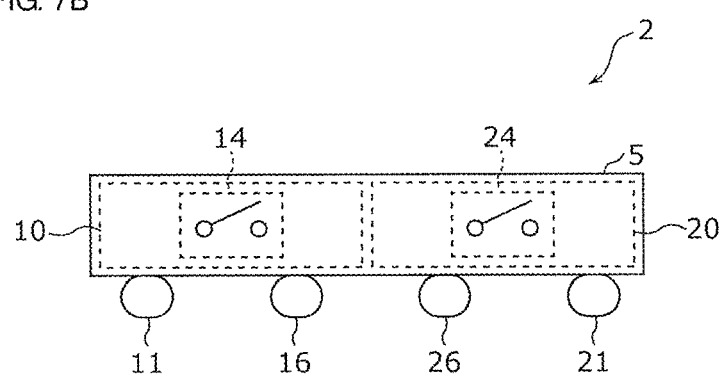
FIG. 7B is a diagram schematically illustrating a state in which a first shunt switch and a second shunt switch are built into a single chip.

FIG. 7B is a diagram schematically illustrating a state in which the first shunt switch 14 and the second shunt switch 24 are built into the single chip 5. As schematically illustrated in FIG. 7B, since the first shunt switch 14 and the second shunt switch 24 are not provided separately from the chip 5 and are instead built into the chip 5, an increase in the size of the module in which the radio-frequency switch 2, the first shunt switch 14, and the second shunt switch 24 are mounted is able to be reduced or prevented while maintaining isolation.

In addition, the chip 5 includes the various terminals of the first switch circuit 10 (first common terminal 11, first selection terminals 12a and 12b, and ground terminal connected to ground) and the various terminals of the second switch circuit 20 (second common terminal 21, second selection terminals 22a to 22d, and ground terminal connected to ground). These various terminals are preferably bumps or surface electrodes (pads) provided on the chip 5, for example. In FIG. 7B, a ground terminal 16 is a ground-side terminal of the first shunt switch 14 and a ground terminal 26 is a ground-side terminal of the second shunt switch 24, and the first common terminal 11, the second common terminal 21, and the ground terminals 16 and 26 are illustrated as bumps. As illustrated in FIG. 7B, the ground terminals 16 and 26 are disposed between the first common terminal 11 and the second common terminal 21.

There is a risk of the first common terminal 11 and the second common terminal 21 being disposed close to each other on the chip 5 when the first switch circuit 10 and the second switch circuit 20 are provided in a single chip 5. In this case, isolation between the first common terminal 11 and the second common terminal 21 would be reduced. Due to this, as illustrated in FIG. 7B, the ground terminals 16 and 26 are disposed between the first common terminal 11 and the second common terminal 21, and, therefore, the first common terminal 11 and the second common terminal 21 are spaced apart from one another by at least the distance occupied the ground terminals 16 and 26. Furthermore, a signal leaking between the first common terminal 11 and the second common terminal 21 is able to be blocked by the ground terminals 16 and 26. Thus, the isolation between the first common terminal 11 and the second common terminal 21 is able to be increased.

Preferred Embodiment 3

In the preferred embodiment 1, the matching networks 41 and 42 are provided separately from the radio-frequency switch 1, and the radio-frequency switch 1 does not include the matching networks 41 and 42, but the radio-frequency switch 1 may preferably include the matching networks 41 and 42.

Figure 8:
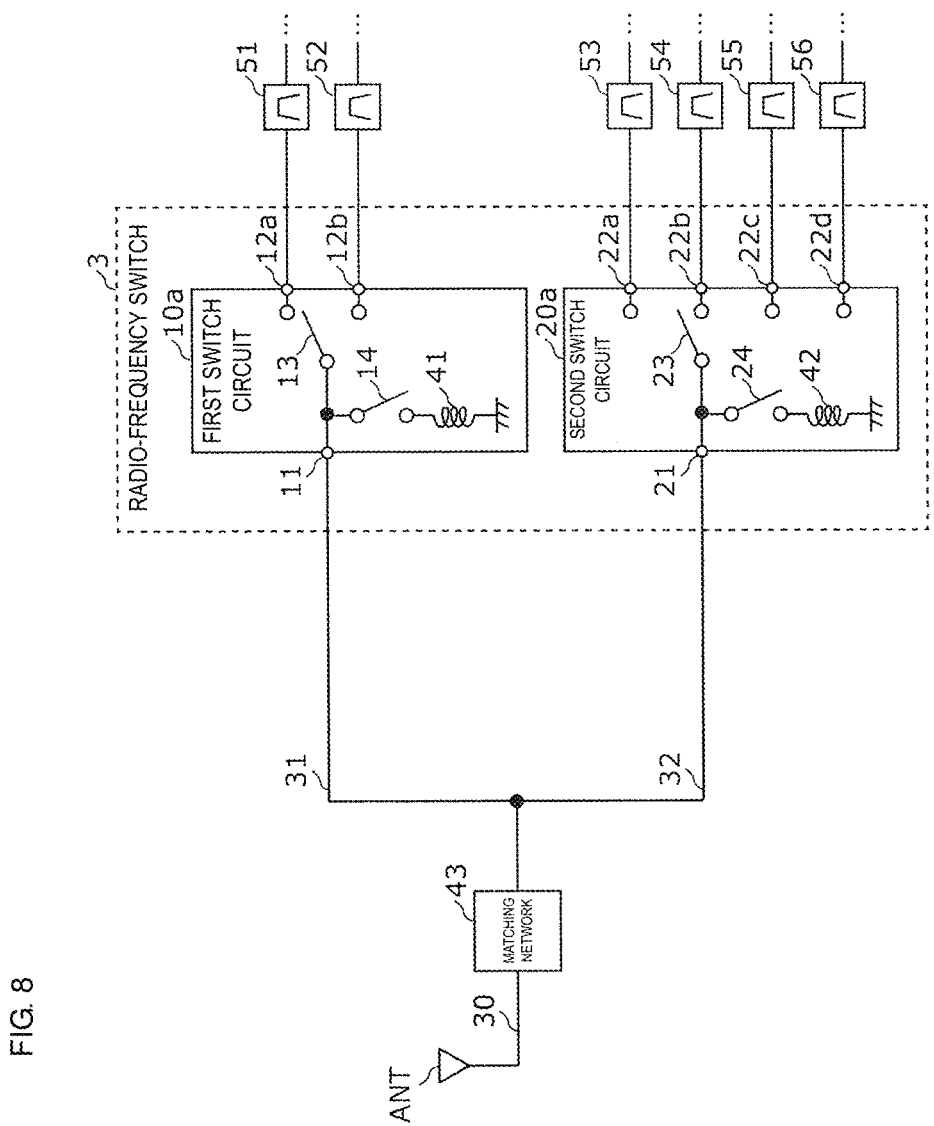
FIG. 8 is a configuration diagram of a radio-frequency switch according to a preferred embodiment 3 of the present invention and circuits peripheral thereto.

FIG. 8 is a configuration diagram of a radio-frequency switch 3 according to a preferred embodiment 3 of the present invention and circuits peripheral thereto.

The radio-frequency switch 3 includes a first switch circuit 10a and a second switch circuit 20a. In addition to the configuration of the first switch circuit 10, the first switch circuit 10a includes the matching network 41 (first matching network) that is provided on a path that connects the first common terminal 11 and ground to each other via the first shunt switch 14, and in addition, to the configuration of the second switch circuit 20, the second switch circuit 20a includes the matching network 42 (second matching network) that is provided on a path that connects the second common terminal 21 and ground to each other via the second shunt switch 24. Specifically, the matching network 41 is connected between the first shunt switch 14 and ground and the matching network 42 is connected between the second shunt switch 24 and ground. In addition, the matching network 41 may be connected between a connection node between the first common terminal 11 and the first switch 13, and the first shunt switch 14, and the matching network 42 may be connected between a connection node between second common terminal 21 and the second switch 23, and the second shunt switch 24. Furthermore, in FIG. 8, inductors are illustrated as examples of the matching networks 41 and 42. The remainder of the configuration of the radio-frequency switch 3 (first switch circuit 10a and second switch circuit 20a) is the same or substantially the same as in the preferred embodiment 1, and therefore description thereof is omitted.

In the present preferred embodiment, the matching networks 41 and 42 are not provided separately from the radio-frequency switch 3 and are instead provided in the radio-frequency switch 3 and, therefore, the module is able to be reduced in size.

In addition, since the first shunt switch 14 and the second shunt switch 24 are switched off and the first shunt switch 14 and the second shunt switch 24 may be regarded as capacitance components when CA is performed, matching is able to be effectively obtained for the first switch circuit 10*a* and the second switch circuit 20*a* using the LC circuits defined by the capacitance components and the matching networks 41 and 42.

Furthermore, when CA is not performed, the shunt switch of the switch circuit corresponding to the frequency band not used in the communication is switched on and the shunt switch of the switch circuit corresponding to the frequency band used in the communication is switched off. For example, in the case in which the first shunt switch 14 is switched on and the second shunt switch 24 is switched off, the matching network 41 connected to the first shunt switch 14 is shunt-connected to the second switch circuit 20*a*. Therefore, matching for the second switch circuit 20*a* is able to be performed using the matching network 41 connected to the first shunt switch 14, the matching network 42 connected to the second shunt switch 24, and the second shunt switch 24 defining and functioning as a capacitance component. Thus, since matching is able to be performed using a plurality of matching networks and a capacitance component, it is easier to perform impedance adjustment. Similarly, in the case in which the first shunt switch 14 is switched off and the second shunt switch 24 is switched on, the matching network 42 connected to the second shunt switch 24 is shunt-connected to the first switch circuit 10*a*. Therefore, matching is able to be performed for the first switch circuit 10*a* using the matching network 41, the matching network 42, and the first shunt switch 14 defining and functioning as a capacitance component. Thus, since matching is able to be performed using a plurality of matching networks and a capacitance component, it is easier to perform impedance adjustment.

Furthermore, a notch filter is defined by the matching network 41 and the first shunt switch 14 defining and functioning as a capacitance component when switched off. Therefore, for example, in the case in which the first shunt switch 14 is switched off and the second shunt switch 24 is switched on, the attenuation characteristic outside the first frequency band is able to be improved by the notch filter defined by the matching network 41 and the first shunt switch 14.

Furthermore, a notch filter is defined by the matching network 42 and the second shunt switch 24 defining and functioning as a capacitance component when switched off. Therefore, for example, in the case in which the first shunt switch 14 is switched on and the second shunt switch 24 is switched off, the attenuation characteristic outside the second frequency band is able to be improved by the notch filter defined by the matching network 42 and the second shunt switch 24.

Thus, the attenuation characteristic outside a pass band used in communication are able to be improved by defining a notch filter using a matching network and a shunt switch.

Preferred Embodiment 4

A radio-frequency switch according to a preferred embodiment of the present invention may be applied to a communication device.

Figure 9:
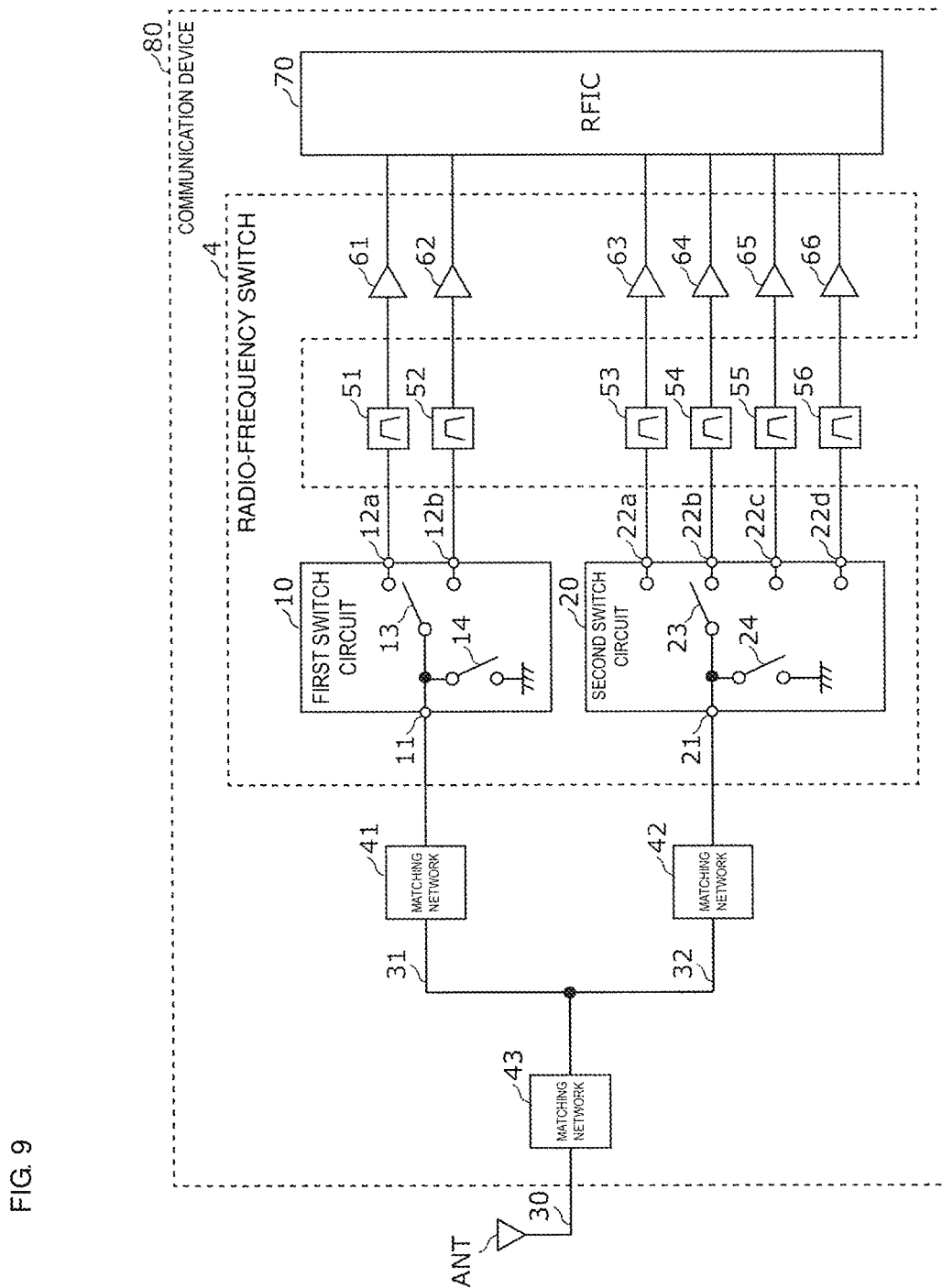
FIG. 9 is a configuration diagram of a communication device according to a preferred embodiment 4 of the present invention.

FIG. 9 is a configuration diagram of a communication device 80 according to a preferred embodiment 4 of the present invention. In FIG. 9, a radio-frequency switch 4, the antenna ANT, the matching networks 41 to 43, the filters 51 to 56, and an RF signal processing circuit (RFIC) 70 are illustrated. The radio-frequency switch 4, the matching networks 41 to 43, the filters 51 to 56, and the RFIC 70 define the communication device 80.

The first switch circuit 10, the second switch circuit 20, the matching networks 41 to 43, the filters 51 to 56, and the antenna ANT are the same or substantially the same as in the preferred embodiment 1, and therefore, description thereof is omitted. In addition, the antenna ANT may be built into the communication device 80.

The radio-frequency switch 4 transmits a radio-frequency signal between the antenna ANT and the RFIC 70. Specifically, the radio-frequency switch 4 transmits radio-frequency signals received by the antenna ANT to the RFIC 70 via reception signal paths. The radio-frequency switch 4 includes amplification circuits 61 to 66 in addition to the first switch circuit 10 and the second switch circuit 20. Thus, the radio-frequency switch 4, which includes the amplification circuits 61 to 66, is able to be provided that supports CA and increases isolation.

The amplification circuits 61 to 66 amplify radio-frequency signals filtered by the filters 51 to 56. The amplification circuits 61 to 66 are preferably low-noise amplifiers that amplify radio-frequency reception signals, for example. In addition, the amplification circuits 61 to 66 are not limited to being low-noise amplifiers, and for example, may instead be power amplifiers that amplify radio-frequency transmission signals.

The RFIC 70 processes radio-frequency signals transmitted and received by the antenna ANT. Specifically, the RFIC 70 subjects a radio-frequency signal input thereto from the antenna ANT via a reception signal path of the radio-frequency switch 4 to signal processing using down conversion, for example, and outputs a reception signal generated through the signal processing to a baseband signal processing circuit (not illustrated).

The radio-frequency switch 4 is able to support CA and increase isolation similarly to the radio-frequency switch 1. Therefore, the communication device 80 is able to be provided that supports CA and increases isolation.

The communication device 80 includes the radio-frequency switch 4, but may instead include any of the radio-frequency switches 1 to 3.

Radio-frequency switches and communication devices according to preferred embodiments of the present invention have been described above with reference to preferred embodiments 1 to 4, but the present invention is not limited to the above-described preferred embodiments. Other preferred embodiments achieved by combining any of the elements of the above-described preferred embodiments and modifications obtained by modifying the above-described preferred embodiments in various ways, as thought of by a person skilled in the art, without departing from the spirit of the present invention are also included in the scope of the present invention.

For example, in the above-described preferred embodiments, the second switch circuits 20 and 20*a* include the second shunt switch 24, but do not have to include the second shunt switch 24. However, it is preferable that the second switch circuits 20 and 20*a* include the second shunt switch 24 in order to increase isolation between the first common terminal 11 and the first selection terminals 12*a* and 12*b* when only the first frequency band is used in the case in which CA is not performed.

Furthermore, for example, in the above-described preferred embodiments, the first switch circuits 10 and 10*a* preferably include two first selection terminals 12*a* and 12*b*, but may instead include three or more first selection terminals. In addition, the second switch circuits 20 and 20*a* include four second selection terminals 22*a* to 22*d*, but may include two, three, five or more second selection terminals.

Furthermore, for example, in the above-described preferred embodiments, the first frequency band and the second frequency band are preferably LB and VLB, but the first frequency band and the second frequency band are not limited to these examples. For example, the first frequency band and the second frequency band may be a LB and a middle band (MB), an LB and a high band (HB), an MB and a HB, and other suitable bands.

In addition, for example, in the above-described preferred embodiments, radio-frequency switches are provided in reception paths for radio-frequency signals, but may instead be provided in transmission paths for radio-frequency signals.

Furthermore, for example, in the preferred embodiment 1, the first shunt switch 14 is built into the first chip 15 and the second shunt switch 24 is built into the second chip 25, but the present invention is not limited to this configuration. For example, the first shunt switch 14 may be provided on the first chip 15 and the second shunt switch 24 may be provided on the second chip 25.

In addition, for example, in the preferred embodiment 2, the first shunt switch 14 and the second shunt switch 24 are built into the chip 5, but the present invention is not limited to this configuration. For example, the first shunt switch 14 and the second shunt switch 24 may be provided on the chip 5.

Preferred embodiments of the present invention may be widely used in communication devices, such as cellular phones, for example, as a radio-frequency switch and a communication device that are able to be applied to multi-band systems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency switch comprising:
    a first switch circuit including:
        a first common terminal;
        at least two first selection terminals;
        a first switch that selectively connects the first common terminal and the at least two first selection terminals to each other; and
        a first shunt switch that switches the first common terminal and ground between a conductive state and a non-conductive state with each other; and
    a second switch circuit including:
        a second common terminal that is connected to the first common terminal;
        at least two second selection terminals; and
        a second switch that selectively connects the second common terminal and the at least two selection terminals to each other.

2. The radio-frequency circuit according to claim 1, wherein the second switch circuit further includes a second shunt switch that switches the second common terminal and ground between being in a conductive state and a non-conductive state with each other.

3. The radio-frequency switch according to claim 2, wherein
    the first switch circuit is provided in a first chip;
    the first shunt switch is built into the first chip;
    the second switch circuit is provided in a second chip; and
    the second shunt switch is built into the second chip.

4. The radio-frequency switch according to claim 2, wherein
    the first switch circuit and the second switch circuit are provided in one chip; and
    the first shunt switch and the second shunt switch are built into the one chip.

5. The radio-frequency switch according to claim 4, wherein
    the one chip includes the first common terminal, the second common terminal, and a ground terminal that is connected to ground; and
    the ground terminal is disposed between the first common terminal and the second common terminal.

6. The radio-frequency switch according to claim 2, wherein
    the first switch circuit is used in communication in a first frequency band;
    the second switch circuit is used in communication in a second frequency band, which is different from the first frequency band;
    when the first shunt switch is switched off, the first common terminal and ground are in the non-conductive state with each other, the second shunt switch is switched on, and the second common terminal and ground are in the conductive state with each other when transmission or reception of a signal is performed with the first frequency band being a pass band; and
    when the first shunt switch is switched on, the first common terminal and ground are in the conductive state with each other, the second shunt switch is switched off, and the second common terminal and ground are in the non-conductive state with each other when transmission or reception of the signal is performed with the second frequency band being the pass band.

7. The radio-frequency switch according to claim 6, wherein
    the first frequency band is a band included in a region from an 800 MHz band to a 900 MHz band; and
    the second frequency band is a band included in a region from a 600 MHz band to a 700 MHz band.

8. The radio-frequency switch according to claim 6, wherein the first frequency band is Band 8 of long term evolution and the second frequency band is Band 20 of long term evolution.

9. The radio-frequency switch according to claim 6, wherein the first frequency band is Band 8 of long term evolution; and the second frequency band is Band 28 of long term evolution.

10. The radio-frequency switch according to claim 6, wherein the first frequency band is Band 26 of long term evolution; and the second frequency band is Band 12, Band 13, or Band 17 of long term evolution.

11. The radio-frequency switch according to claim 6, wherein the first frequency band is Band 26 of long term evolution; and the second frequency band is Band 29 of long term evolution.

12. The radio-frequency switch according to claim 2, wherein
    the first switch circuit further includes a first matching network that is provided on a path that connects the first common terminal and ground to each other via the first shunt switch; and
    the second switch circuit further includes a second matching network that is provided on a path that connects the second common terminal and ground to each other via the second shunt switch.

13. The radio-frequency switch according to claim 12, wherein the first matching network and the first shunt switch define a notch filter.

14. The radio-frequency switch according to claim 12, wherein the second matching network and the second shunt switch define a notch filter.

15. The radio-frequency switch according to claim 1, further comprising:
 an amplification circuit.

16. A communication device comprising:
 an RF signal processing circuit that processes a radio-frequency signal transmitted or received by an antenna element; and
 the radio-frequency switch according to claim 1; wherein
 the radio-frequency switch transmits the radio-frequency signal between the antenna element and the RF signal processing circuit.

17. The communication device according to claim 16, wherein the second switch circuit further includes a second shunt switch that switches the second common terminal and ground between being in a conductive state and a non-conductive state with each other.

18. The communication device according to claim 17, wherein
 the first switch circuit is provided in a first chip;
 the first shunt switch is built into the first chip;
 the second switch circuit is provided in a second chip; and
 the second shunt switch is built into the second chip.

19. The communication device according to claim 17, wherein
 the first switch circuit and the second switch circuit are provided in one chip; and
 the first shunt switch and the second shunt switch are built into the one chip.

20. The communication device according to claim 19, wherein
 the one chip includes the first common terminal, the second common terminal, and a ground terminal that is connected to ground; and
 the ground terminal is disposed between the first common terminal and the second common terminal.

* * * * *